(12) United States Patent
Robin et al.

(10) Patent No.: US 12,166,149 B2
(45) Date of Patent: Dec. 10, 2024

(54) LIGHT-EMITTING DIODE WITH ELECTRODES ON A SINGLE FACE AND PROCESS OF PRODUCING THE SAME

(71) Applicant: ALEDIA, Echirolles (FR)

(72) Inventors: Ivan-Christophe Robin, Grenoble (FR); Xavier Hugon, Teche (FR); Philippe Gilet, Teche (FR); Tiphaine Dupont, Grenoble (FR)

(73) Assignee: ALEDIA, Echirolles (FR)

( * ) Notice: Subject to any disclaimer, the term of this patent is extended or adjusted under 35 U.S.C. 154(b) by 807 days.

(21) Appl. No.: 17/296,110

(22) PCT Filed: Nov. 20, 2019

(86) PCT No.: PCT/EP2019/081872
§ 371 (c)(1),
(2) Date: May 21, 2021

(87) PCT Pub. No.: WO2020/104495
PCT Pub. Date: May 28, 2020

(65) Prior Publication Data
US 2021/0399166 A1     Dec. 23, 2021

(30) Foreign Application Priority Data
Nov. 22, 2018  (FR) .................................... 1871719

(51) Int. Cl.
*H01L 33/06* (2010.01)
*H01L 25/075* (2006.01)
(Continued)

(52) U.S. Cl.
CPC .......... *H01L 33/06* (2013.01); *H01L 25/0753* (2013.01); *H01L 33/007* (2013.01);
(Continued)

(58) Field of Classification Search
CPC ....................................................... H01L 33/06
(Continued)

(56) References Cited

U.S. PATENT DOCUMENTS 5,317,170 A * 5/1994 Paoli ..................... H01L 27/153
372/50.122
2007/0096127 A1    5/2007 Pattison et al.
(Continued)

FOREIGN PATENT DOCUMENTS

CN         105470362 A  *  4/2016  ............ H01L 33/42
EP         0488772 A1       6/1992
(Continued)

OTHER PUBLICATIONS

Meyaard et al., D.S., "Mesa-Free III-V Nitride Light-Emitting Diodes with Flat Surface," ECS Solid State Letters, vol. 3, No. 4, Feb. 12, 204, pp. Q17-Q19.
(Continued)

*Primary Examiner* — Ajay Arora
(74) *Attorney, Agent, or Firm* — HAUPTMAN HAM, LLP (57) ABSTRACT

A light-emitting diode 100 includes a first region 1, for example of the P type, formed in a first layer 10 and forming, in a direction normal to a basal plane, a stack with a second region 2 having at least one quantum well formed in a second layer 20, and including a third region 3, for example of the N type, extending in the direction normal to the plane, bordering and in contact with the first and second regions 1, 2, through the first and second layers 10, 20. A process for producing a light-emitting diode 100 in which the third region 3 is formed by implantation into and through the first and second layers 10, 20.

15 Claims, 6 Drawing Sheets

(51) Int. Cl.
*H01L 33/00* (2010.01)
*H01L 33/10* (2010.01)
*H01L 33/50* (2010.01)
*H01L 33/32* (2010.01)

(52) U.S. Cl.
CPC ............ *H01L 33/105* (2013.01); *H01L 33/50* (2013.01); *H01L 33/0095* (2013.01); *H01L 33/325* (2013.01)

(58) Field of Classification Search
USPC ........................................................ 257/89
See application file for complete search history.

(56) References Cited

U.S. PATENT DOCUMENTS

| | | | |
|---|---|---|---|
| 2014/0247853 A1* | 9/2014 | Deppe | ................ H01S 5/18305 372/50.11 |
| 2015/0214425 A1* | 7/2015 | Taylor | ................... H01L 27/085 257/14 |
| 2017/0277065 A1 | 9/2017 | Kondo | |
| 2018/0040772 A1 | 2/2018 | Rudolph | |
| 2018/0212108 A1 | 7/2018 | Leirer et al. | |

FOREIGN PATENT DOCUMENTS

| | | |
|---|---|---|
| EP | 2960940 A1 | 12/2015 |
| KR | 10-2017-0023097 A | 3/2017 |

OTHER PUBLICATIONS

International Search Report and Written Opinion issued in corresponding International Application No. PCT/EP2019/081872, mailed Apr. 23, 2020, pp. 1-15, European Patent Office, Rijswijk, Netherlands.

* cited by examiner

LIGHT-EMITTING DIODE WITH ELECTRODES ON A SINGLE FACE AND PROCESS OF PRODUCING THE SAME

The present application is a U.S. National Phase of International Application Number PCT/EP2019/081872, filed Nov. 20, 2019, which claims priority to French Application No. 1871719, filed Nov. 22, 2018.

TECHNICAL FIELD

This invention relates to the optoelectronic field. It has at least one particularly advantageous application in the field of light-emitting diodes (LEDs). One advantageous but non-limiting application concerns the production of LED-based display screens.

PRIOR ART

A display screen generally comprises a plurality of pixels emitting independently from one another.

In the case where these pixels comprise their own light source, they can be qualified as self-illuminating or photo-emitting pixels.

A display screen with such self-illuminating pixels does not require a backlight system, unlike LCD (Liquid Crystal Display) screens.

Self-illuminating pixels can be formed with a LED base, for example organic LEDs or OLEDs (Organic Light-Emitting Diodes), or solid-state LEDs having an inorganic material base.

A LED typically comprises a region having P-type electric conductivity and a region having N-type electric conductivity, forming a P-N junction therebetween. By polarising the LED, an electron from the N-type region can recombine with a hole from the P-type region. This recombination of carriers (electrons, holes) is said to be radiative if it is accompanied by the emission of a photon.

Solid-state LEDs can further comprise a quantum well region. These quantum wells are configured to spatially confine carrier recombination and optimise photon emission.

Solid-state LEDs have the particular advantage of having a higher luminosity than OLEDs. They also have a longer life span than OLEDs.

One challenge in producing display screens comprising self-illuminating pixels with a solid-state LED base is to reduce the size of each pixel and the spacing between pixels, in order to reduce costs and increase screen resolution.

Such solid-state LEDs are sometimes referred to as micro-LEDs or μLEDs.

The U.S. patent No. 2015/0380459 A1 discloses a system and a process for producing μLEDs having a mesa structure.

Such a mesa structure is generally required to make electrical contacts on the N-type and P-type regions respectively.

One drawback of these μLEDs is that the radiative recombination rate thereof, and consequently the external quantum efficiency thereof, falls drastically as the size thereof decreases.

Figure 1:
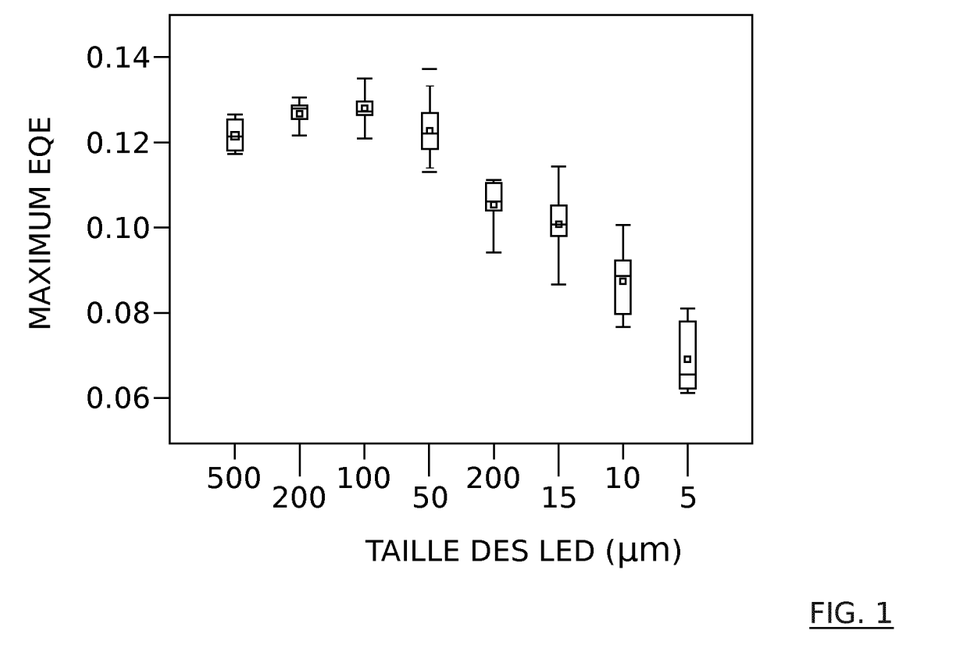
FIG. 1 shows the results of measuring the efficiency of a LED as a function of the size thereof as per the document "Society for Information Display, International Symposium, Book 1, Session 25-4: Investigation and Improvement of 10 μm Pixel☐pitch GaN☐based Micro☐LED Arrays with Very High Brightness, F. Olivier et al. (2017)"

FIG. 1 shows, for example, the maximum external quantum efficiency (maximum EQE) of μLEDs according to the prior art as a function of their size. This efficiency decreases drastically for μLED sizes below 50 μm.

Another solution disclosed by the document "Mesa-Free III-V Nitride Light-Emitting Diodes with Flat Surface, David S. Meyaard et al, ECS Solid State Letters, 3 (4) Q17-Q19 (2014)" consists of retaining a flat surface for making the contacts on the μLEDs, in order to reduce the production cost of these μLEDs.

One drawback of this solution is the occurrence of mutual optical couplings between adjacent LEDs when the spacing between LEDs is reduced.

Another drawback of this solution is that the electrons from the N-type region are not perfectly confined to the quantum wells. Thus, carrier recombination in the quantum wells is not optimal.

One purpose of the present invention is to overcome, at least in part, some of the aforementioned drawbacks.

According to one specific aspect, one purpose of the present invention is to propose a light-emitting diode with improved efficiency.

According to another aspect, one purpose of the present invention is to propose an optoelectronic system comprising a plurality of light-emitting diodes with improved efficiency and/or that prevent the occurrence of mutual optical couplings.

According to a separable aspect, one purpose of the present invention is to propose a process for producing a light-emitting diode with improved efficiency.

Other purposes, features and advantages of the present invention will appear upon reading the following description and the accompanying drawings. It is understood that other advantages can be incorporated.

SUMMARY

To achieve this objective, a first aspect of the invention relates to a light-emitting diode configured to emit a luminous flux of wavelength $\lambda_i$ (i=1 . . . 3), comprising a first region having one of either a P-type electric conductivity or an N-type electric conductivity, formed in a first layer extending in a basal plane, a second region formed in a second layer, said second region forming a stack with the first region in a direction normal to the basal plane, referred to as a longitudinal direction, and comprising at least one quantum well extending parallel to said basal plane, and a third region having the other of either a P-type electric conductivity or an N-type electric conductivity.

Advantageously, yet without being limiting, the third region extends in the longitudinal direction bordering and in contact with the first and second regions through the first and second layers.

This arrangement allows a P-N junction to be formed laterally.

This lateral P-N junction generates a space charge region (SCR) developing laterally on either side of the junction. The SCR pushes part of the carriers towards a central region of the LED.

This disposition thus advantageously favours carrier recombinations in the central region of the LED, and reduces or prevents carrier recombinations at the border of the LED.

Carrier recombinations in the central region of the LED are essentially radiative, whereas carrier recombinations at the border of the LED can be non-radiative. In particular, non-radiative recombinations of the Shockley-Read-Hall (SRH) type can occur in the presence of structural defects. Such defects are generally more numerous at the border of the LED than in the central region of the LED.

The lateral P-N junction according to the invention thus advantageously allows the border of the LED to be passivated.

The radiative recombination rate is thus optimised. The efficiency of the LED is improved.

For high dopant concentrations, for example for a dopant concentration greater than or equal to $1\times10^{18}$ cm$^{-3}$, the width of the SCR decreases and this third region can allow carriers to be laterally injected.

In such a case, there is no lateral isolation zone at the border of the first and second regions. The layers underlying the second region do not contribute to the electrical operation of the LED. This improves the compactness of the LED.

No carrier injection takes place from these underlying layers. Carrier injection takes place directly from the third region through the first layer. Carrier injection is optimised. Carrier injection can be particularly efficient for LED sizes of less than twice the mean free path of the carriers.

To improve the efficiency of the LED from a solution such as that taught by the aforementioned document "Mesa-Free III-V Nitride Light-Emitting Diodes with Flat Surface, David S. Meyaard et al, ECS Solid State Letters, 3 (4) Q17-Q19 (2014)", a person skilled in the art would, at best, be encouraged to add an EBL (Electron Blocking Layer). More specifically, such a layer is generally used to spatially regulate the injection of carriers in the longitudinal direction such that the recombinations of these carriers takes place mainly in the quantum wells.

FIGS. 2A-2C and 3A-3C show simulation results for a LED according to the invention, with and without an EBL (FIGS. 2A and 3A) respectively.

Figure 2A:
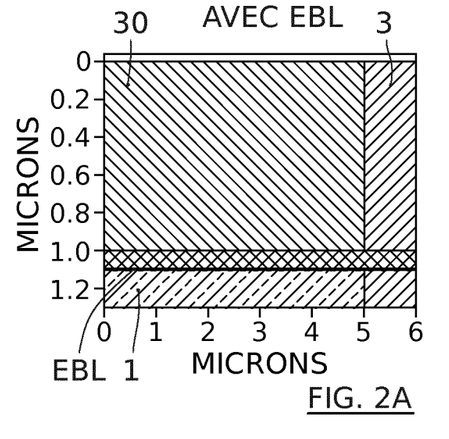
FIG. 2A is a sectional modelling of a LED according to one embodiment of the present invention, to which an EBL has been added.
Figure 2B:
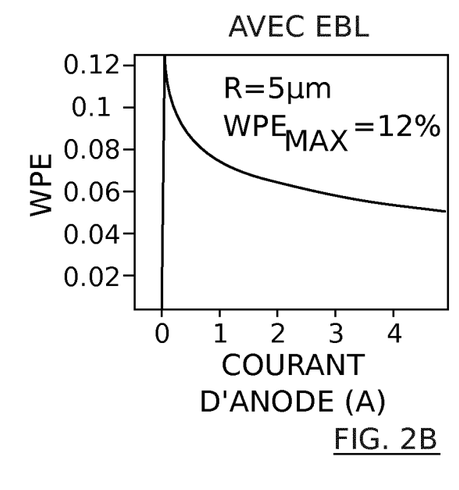
FIGS. 2B and 2C show results from the modelling of a LED according to one embodiment of the present invention, to which an EBL has been added, for LED widths of 5 μm and 1 μm respectively.
Figure 2C:
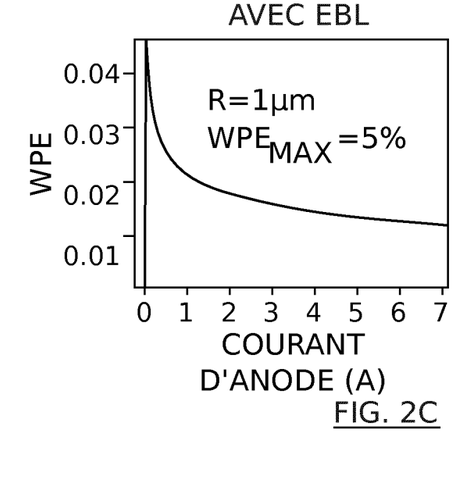
Figure 3A:
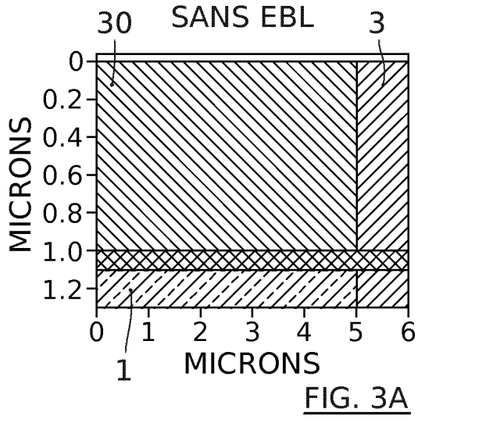
FIG. 3A is a sectional modelling of a LED according to one embodiment of the present invention, without any EBL.
Figure 3B:
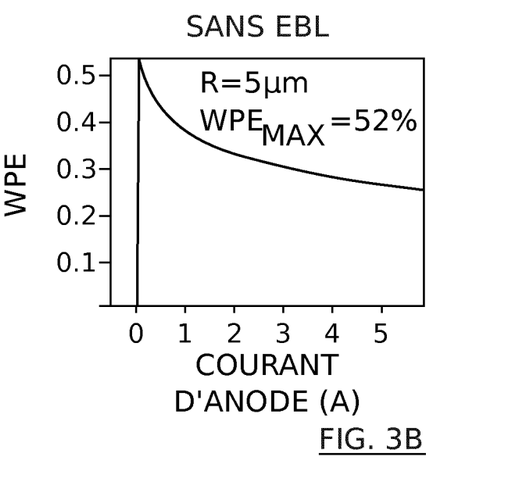
FIGS. 3B and 3C show results from the modelling of a LED according to one embodiment of the present invention, without any EBL, for LED widths of 5 μm and 1 μm respectively.
Figure 3C:
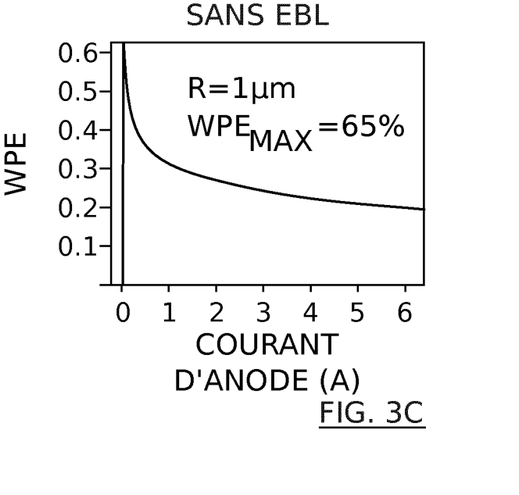

It appears that the presence of an EBL is detrimental to the WPE (Wall Plug Efficiency) of the LED according to the invention (FIGS. 2B and 3B), and even more so for the smaller LED sizes (FIGS. 2C and 3C). A detailed description of these FIGS. 2A-2C and 3A-3C is given hereinbelow.

The solution disclosed by the aforementioned document would at best lead a person skilled in the art to produce a LED with an EBL, the efficiency whereof is very significantly degraded. This disclosure deviates from the invention.

Conversely, according to the invention, carrier injection is spatially regulated by the lateral development of the SCR around the P-N junction between the first and third regions of the LED.

According to one preferred embodiment, the LED has a mesa structure comprising the first and second regions and oriented in the longitudinal direction. The third region thus forms an edge of this mesa structure.

The mesa structure of the LED prevents or limits the occurrence of mutual optical couplings when a plurality of LEDs are arranged next to one another. In particular, a refractive index contrast occurs between the inside of the mesa and the outside of the mesa and this contrast allows photons to be confined within the mesa, thus preventing the coupling of optical modes between adjacent LEDs.

Passivation of the edge of the mesa by forming the third region longitudinally also prevents non-radiative recombinations at the mesa edges. This increases the radiative recombination rate compared to the non-radiative recombination rate. The efficiency of the mesa-structured LED according to the invention is thus improved.

A second aspect of the invention relates to an optoelectronic system comprising a plurality of LEDs according to the first aspect of the invention, the LEDs of said plurality being juxtaposed with one another in the basal plane at the respective third regions thereof. The LEDs are preferably carried on the same basal plane and positioned next to one another.

Advantageously, this system enables a LED array to be formed, the efficiency whereof is improved.

According to one preferred embodiment, this system advantageously allows for the formation of an array of LEDs having a mesa structure, electrically and optically isolated from one another.

The efficiency of the mesa-structured LEDs of this system is thus improved. The size of the LEDs can be reduced. Moreover, these mesa-structured LEDs prevent mutual optical couplings from occurring. The spacing between these LEDs can thus be advantageously reduced.

The LED system according to the invention can advantageously equip a display screen.

One separable aspect of the invention relates to a process for producing at least one light-emitting diode (LED) configured to emit a luminous flux of wavelength $\lambda_i$ (i=1 . . . 3).

This production process comprises at least the following steps of:
Forming a stack in one direction, referred to as a longitudinal direction, comprising:
a GaN buffer layer deposited on a first substrate extending in a basal plane normal to the longitudinal direction,
an N-doped GaN layer deposited on the first buffer layer,
an unintentionally doped quantum well layer comprising at least one InGaN-based quantum well extending parallel to the basal plane,
a P-doped GaN layer deposited on the quantum well layer,
Lithographically defining, on an exposed face of the P-doped GaN layer, at least one pattern comprising a central region and a border surrounding this central region,
Implanting silicon at each border from the exposed face to a depth greater than or equal to the sum of the thicknesses of the P-doped GaN layer and of the quantum well layer, so as to delimit, in each central region, a first P-type region in the P-doped GaN layer and a second region in the quantum well layer, and so as to form a third N-type region in the implanted material,
Depositing a first metal contact on the first region and a second metal contact on the third region at the exposed face, so as to form at least one diode configured to emit a luminous flux of wavelength $\lambda_i=\lambda_1$.

Ion implantation of silicon in the P-doped GaN layer advantageously reverses the P-type doping to form the third N-type region in said layer.

According to one advantageous embodiment, this production process can further comprise the following steps:
When forming the N-doped GaN layer, forming an AlN-based etch stop layer within said N-doped GaN layer, this etch stop layer being intended to precisely stop an etching of the formed stack,
Prior to implantation, etching trenches at the periphery of each border from the exposed face of the P-doped GaN layer, at least as far as the quantum well layer, preferably at least as far as the N-doped GaN layer, and preferably at least as far as a first interface between the etch stop layer and the N-doped GaN layer,
After etching, depositing the first and second metal contacts,
Transferring the at least one diode formed on a second substrate comprising CMOS-type control electronics, the face carrying the first and second metal contacts facing the control electronics,
Removing the first substrate,
Etching the GaN buffer layer and at least part of the N-doped GaN layer, preferably as far as the first interface between the etch stop layer and the N-doped GaN layer, so as to form a resonant cavity for a luminous flux of wavelength $\lambda_i = \lambda_1$, said resonant cavity having a height $e_1$ in the longitudinal direction such that:

$$e_1 = M_1 \frac{\lambda_1}{2n_{\mathit{eff},1}},$$

Where $M_1$ is an integer, $\lambda_1$ is the emission wavelength and $n_{\mathit{eff},1}$ is a first effective refractive index, Optionally, forming on a third substrate at least one wavelength converter $c_j$ (j=2 . . . 3) configured to produce at least one luminous flux of wavelength $\lambda_i = \lambda_j$ (j=2 . . . 3) from a luminous flux of wavelength $\lambda_i = \lambda_1$, the at least one converter $c_j$ (j=2 . . . 3) taking the form of a resonant conversion cavity having a height $e_j$ (j=2 . . . 3) in the longitudinal direction such that:

$$e_j = M_j \frac{\lambda_j}{2n_{\mathit{eff},j}},$$

Where $M_j$ is an integer, is the conversion wavelength and $n_{\mathit{eff},j}$ is a $j^{th}$ effective refractive index, Optionally, transferring the third substrate carrying the at least one converter $c_j$ (j=2 . . . 3) opposite the at least one resonant cavity light-emitting diode, and aligning the at least one converter and the at least one diode along a common longitudinal axis, Optionally, securing the third substrate and the at least one diode to form a screen comprising at least one colour pixel.

The process according to this aspect of the invention provides for removing the buffer layer and at least part of the N-doped GaN layer. More specifically, the buffer layer has structural defects that are detrimental to the efficiency of the LED. The N-doped GaN layer is generally formed by epitaxial growth on the buffer layer and also has certain residual structural defects. The removal thereof is thus advantageous. This also reduces the overall thickness of the stack. Such a reduction in thickness is advantageously compatible with the production of single-mode LEDs or LEDs with a low number of optical modes.

The process according to the invention thus makes it possible to eliminate these defects, which are sources of non-radiative recombinations.

The process according to the invention also makes it possible to dispense with a step for forming an electron blocking layer (EBL). Each LED produced by the process according to the invention is preferably configured to laterally inject electrons. An EBL thus becomes unnecessary. An EBL would furthermore be detrimental to the efficiency of the LED produced by the process according to the invention, as explained hereinabove with reference to FIGS. 2A-2C and 3A-3C.

The process according to the invention is thus simpler than a process for producing LEDs with an EBL, and allows more efficient LEDs to be produced. It further allows the height of the stack formed to be adjusted more precisely, over a wider range of heights.

The aims, purposes, features and advantages of the invention will be better understood upon reading the detailed description of embodiments thereof, which are shown by means of the following accompanying drawings, in which.

The drawings are provided by way of example and are not intended to limit the scope of the invention. They constitute diagrammatic views intended to ease the understanding of the invention and are not necessarily to the scale of practical applications. In particular, the thicknesses and dimensions of the different layers and regions of the LEDs shown are not representative of reality.

DETAILED DESCRIPTION

Before giving a detailed description of the embodiments of the invention, it should be recalled that the invention according to the first aspect thereof in particular comprises the optional features given hereinbelow, which can be used in combination with one another or alternately:

The light-emitting diode has a mesa structure.

The third region forms an edge of the mesa structure.

This arrangement makes it possible to confine the carrier recombinations to the inside of the mesa and reduce or even prevent carrier recombinations occurring at the periphery, which are mostly non-radiative. In particular, peripheral recombinations of the Shockley-Read-Hall type that are non-radiative are significantly limited.

The edge of the mesa structure has a free surface that is substantially normal to the basal plane.

The free surface can thus be exposed to air, thus increasing a refractive index contrast between the inside of the mesa and the outside of the mesa.

The first region has a P-type electric conductivity, and the third region has an N-type electric conductivity.

The third region has a dopant concentration greater than or equal to $1 \times 10^{18}$ cm$^{-3}$.

Since the mobility of the electrons is greater than that of the holes, the electrons are injected laterally from the edge towards the centre of the diode. Carrier recombination in the at least one quantum well is thus optimised. Such a lateral injection of carriers also overcomes the need for an electron blocking layer (EBL).

The third region has a height substantially equal to the thickness of the first layer.

The third region has a height substantially equal to the sum of the thicknesses of the first and second layers.

The stack forms a resonant cavity in the longitudinal direction for a luminous flux of wavelength $\lambda_i = \lambda_1$.

The resonant cavity has a height $e_1$ in the longitudinal direction such that:

$$e_1 = M_1 \frac{\lambda_1}{2n_{eff,1}}$$

Where $M_1$ is an integer, $\lambda_1$ is the emission wavelength and $n_{eff,1}$ is a first effective refractive index.

The resonant cavity improves the directivity of the diode in the longitudinal direction. The extraction efficiency of the luminous flux of wavelength $\lambda_1$ can thus be improved.

The at least one quantum well is located at a height $e_1^{top}$ in the longitudinal direction from an end of the resonant cavity opposite the first region such that:

$$e_1^{top} = (2M_1' + 1)\frac{\lambda_1}{4n_{eff,1}}$$

Where $M_1'$ is an integer different from $M_1$ or equal to $M_1$.

The radiative recombinations that cause the spontaneous emission of the luminous flux from the diode take place mainly at the level of the at least one quantum well. This positioning of the at least one quantum well corresponds to an antinode of an optical resonance mode of the cavity. Thus, the resonance is optimised for a luminous flux of wavelength $\lambda_1$. The directivity of the diode in the longitudinal direction can be maximised. The extraction efficiency of the luminous flux of wavelength $\lambda_1$ can be maximised.

The light-emitting diode further comprises a wavelength converter $c_j$ (j=2 . . . 3) disposed along a longitudinal axis of the diode and configured to produce a luminous flux of wavelength $\lambda_i = \lambda_j$ (j=2 . . . 3) from an emitted luminous flux of wavelength $\lambda_i = \lambda_1$.

In particular, such a converter allows for the formation of diodes emitting a red or green luminous flux from a spontaneous emission of a blue luminous flux. Such a diode can form a sub-pixel of a unit pixel.

The LED according to the invention is configured to produce an outgoing luminous flux of wavelength $\lambda_i$.

According to one embodiment of the LED without any converter, this outgoing luminous flux has a wavelength $\lambda_i = \lambda_1$. The luminous flux of wavelength $\lambda_1$ can be considered to be a base luminous flux.

According to one embodiment of the LED with a converter, the outgoing luminous flux has a wavelength $\lambda_i = \lambda_j$ (j=2 . . . 3) that is different from the wavelength $\lambda_1$ of the base luminous flux.

The stack comprises the wavelength converter $c_j$ (j=2 . . . 3) and forms a resonant cavity in the longitudinal direction for the luminous flux of wavelength $\lambda_1$ and for the luminous flux of wavelength $\lambda_j$ (j=2 . . . 3).

The converter $c_j$ (j=2 . . . 3) is thus coupled to the source of the luminous flux of wavelength $\lambda_1$ within the same cavity. The extraction efficiency of the luminous fluxes of wavelengths $\lambda_1$ and $\lambda_j$ (j=2 . . . 3) can thus be improved. The integration of this converter into the diode is thus improved. The integration of such a diode into an optoelectronic system can thus be simplified.

The cavity formed by the stack comprising the converter $c_j$ (j=2 . . . 3) has a height $\bar{e}$ in the longitudinal direction such that:

$$\bar{e} = M_1 \frac{\lambda_1}{2n_{eff1}} = M_j \frac{\lambda_j}{2n_{effj}}$$

Where $M_1$, $M_j$ are integers and where $M_j$ is different from $M_1$ or equal to $M_1$, $\lambda_1$ and $\lambda_j$ (j=2 . . . 3) are the emission and conversion wavelengths respectively, and $n_{eff1}$, $n_{effj}$ are a first and a $j^{th}$ effective refractive index respectively.

Such a cavity advantageously allows a resonance to be obtained for each of the two emission and conversion wavelengths, optionally for different optical resonance modes.

The directivity and the extraction efficiency of the luminous fluxes of wavelength $\lambda_1$ and $\lambda_j$ (j=2 . . . 3) are thus improved.

The wavelength converter $c_j$ (j=2 . . . 3) has a centre located at a height $e_j^{top}$ (j=2 . . . 3) in the longitudinal direction from a top end of the resonant cavity such that:

$$e_j^{top} = (2M_j' + 1)\frac{\lambda_j}{4n_{eff,j}}$$

Where $M_j'$ is an integer, $\lambda_j$ is the conversion wavelength and $n_{eff,j}$ is a $j^{th}$ effective refractive index.

The converter $c_j$ (j=2 . . . 3) is thus positioned at an antinode of a resonance mode of the cavity. Thus, the resonance is optimised for luminous fluxes of wavelength $\lambda_j$ (j=2 . . . 3). The directivity of the diode in the longitudinal direction can be maximised. The extraction efficiency of the luminous fluxes of wavelength $\lambda_j$ (j=2 . . . 3) can be maximised.

The wavelength converter $c_j$ (j=2 . . . 3) comprises a resonant conversion cavity.

The converter thus comprises its own resonant cavity, referred to as a resonant conversion cavity, resonating independently from the source of the luminous flux of wavelength $\lambda_1$. Such a cavity can thus be specifically dimensioned for luminous fluxes of wavelength $\lambda_j$ (j=2 . . . 3) from the converter $c_j$ (j=2 . . . 3). Such a cavity can thus be more efficient in improving the directivity and the extraction efficiency of the luminous fluxes of wavelength $\lambda_j$ (j=2 . . . 3) than a coupling of the converter and of the source within the same cavity.

The resonant conversion cavity has a height $e_j$ (j=2 . . . 3) in the longitudinal direction such that:

$$e_j = M_j \frac{\lambda_j}{2n_{eff,j}}$$

Where $M_j$ is an integer, $\lambda_j$ is the conversion wavelength and $n_{eff,j}$ is a $j^{th}$ effective refractive index.

The resonant conversion cavity is bordered, at least in part, by Bragg reflectors extending parallel to the basal plane and configured to be at least partially reflective for a luminous flux of wavelength $\lambda_i=\lambda_j$ (j=2 . . . 3) and transparent for a luminous flux of wavelength $\lambda_i=\lambda_1$.

Bragg reflectors improve the quality of the resonant conversion cavity.

The wavelength converter $c_j$ (j=2 . . . 3) comprises quantum dots.

The wavelength converter $c_j$ (j=2 . . . 3) comprises two-dimensional quantum wells.

The wavelength converter $c_j$ (j=2 . . . 3) is decoupled from the resonant cavity of the diode.

The light-emitting diode further comprises a first metal contact formed on the first region and a second metal contact formed on the third region.

The first and second contacts are carried on the same face of the diode.

This simplifies access to the contacts. The integration of the diode can be improved.

The invention, according to the second aspect thereof, in particular comprises the following optional features which can be used in combination with one another or alternatively to one another:

The system further comprises diode control electronics contacted at a face of the plurality of diodes carrying a plurality of first contacts and of second contacts formed respectively on the first and third regions of each of the diodes of said plurality of diodes.

The system further comprises a plurality of wavelength converters $c_j$ (j=2 . . . 3) configured to produce luminous fluxes of wavelength $\lambda_i=\lambda_j$ (j=2 . . . 3) from an emitted luminous flux of wavelength $\lambda_i=\lambda_1$, each of the converters of said plurality of converters being associated with one diode of the plurality of diodes, so as to form colour pixels.

This system makes it possible to form a screen comprising red, green and blue pixels for example.

The invention, according to the third aspect thereof, in particular comprises the following optional features which can be used in combination with one another or alternatively to one another:

The silicon implantation at the border is configured to form one or more third N-type regions with a dopant concentration greater than or equal to $1\times10^{18}$ cm$^{-3}$.

The at least one converter $c_j$ (j=2 . . . 3) is formed by lithography from a photoresist comprising quantum dots.

A pixel in an image corresponds to the unit element of the image displayed by a display screen. To form a colour image, each colour pixel generally comprises at least three light-emitting and/or light-converting components, also referred to as sub-pixels.

In the description below, each of these sub-pixels emits a luminous flux substantially in one colour (for example, red, green and blue). The colour of a pixel as perceived by an observer comes from the superimposition of the different luminous fluxes emitted by the sub-pixels.

Typically, a LED or µLED emits the luminous flux associated with a sub-pixel. In the present application, the LED size is understood to mean the main dimension in which it extends in the basal plane. The size of a sub-pixel is thus directly correlated to the LED size.

Unless explicitly stated, it should be clarified that, within the context of the present invention, the relative disposition of a third layer sandwiched between a first layer and a second layer does not necessarily mean that the layers are directly in contact with one another, but means that the third layer is either directly in contact with the first and second layers, or is separated therefrom by at least one other layer or at least one other element.

The steps for forming the different regions are to be understood in a broad sense: they can be carried out in several sub-steps which are not necessarily strictly successive.

In the present invention, doping types are indicated. These are non-limiting examples. The invention covers all embodiments wherein the dopings are reversed. Thus, if one example embodiment mentions a P doping for a first region and an N doping for a third region, then the present description describes, at least implicitly, the opposite example wherein the first region has an N doping and the third region has a P doping.

A doping denoted as P includes all dopings by positive charge carriers, regardless of the dopant concentration. Thus, a P-doping can be understood as a P, P+ or P++ doping. Similarly, a doping denoted as N includes all dopings by negative charge carriers, regardless of the dopant concentration. Thus, an N-doping can be understood as an N, N+ or N++ doping.

The following dopant concentration ranges are associated with these different dopings:
P++ or N++ doping: greater than $1\times10^{20}$ cm$^{-3}$
P+ or N+ doping: $1\times10^{18}$ cm$^{-3}$ to $9\times10^{19}$ cm$^{-3}$
P or N doping: $1\times10^{17}$ cm$^{-3}$ to $1\times10^{18}$ cm$^{-3}$
intrinsic doping: $1\times10^{15}$ cm$^{-3}$ to $1\times10^{17}$ cm$^{-3}$ In the description below, the following abbreviations for a material M are optionally used:
M-i refers to the intrinsic or unintentionally doped material M, according to the terminology conventionally used in the field of microelectronics for the suffix -i.
M-n refers to the material M doped with N, N+ or N++, according to the terminology conventionally used in the field of microelectronics for the suffix -n.
M-p refers to the material M doped with P, P+ or P++, according to the terminology conventionally used in the field of microelectronics for the suffix -p.

An "array" is understood to mean a table in the form of rows and columns. For example, an array can comprise a plurality of rows and a plurality of columns, or a single row and a plurality of columns, or a plurality of rows and a single column.

In the present patent application, the terms "light-emitting diode", "LED" or simply "diode" are used synonymously.

A material M-"based" substrate, layer, or device is understood to mean a substrate, a layer, or a device comprising this material M only or comprising this material M and optionally other materials, for example alloying elements, impurities or doping elements. Thus, a gallium nitride (GaN)-based LED can, for example, comprise gallium nitride (GaN or GaN-i) or doped gallium nitride (GaN-p, GaN-n) or indium gallium nitride (InGaN) or aluminium gallium nitride (AlGaN).

In the present patent application, the depth, the height and the thickness are measured in the longitudinal direction, and the width is measured along the basal plane. Preferably, thickness is used to describe a layer, height is used to describe a device, and depth is used to describe an etch or an implantation for example.

"Lateral" and "laterally" are understood to mean, depending on the case:
an orientation of the regions, of the edges or of the interfaces in the longitudinal direction,
an injection mainly directed in a direction of the basal plane, a disposition of the different regions or elements at the periphery of the LED.

A luminous flux of wavelength $\lambda_i$ (i=1 ... 3) is understood to mean a luminous flux whose spectrum primarily comprises the wavelength $\lambda_i$ (i=1 ... 3). This luminous flux is not necessarily monochromatic.

In the description below, an effective refractive index is defined for a material, optionally for an average or model material, and for an optical resonance mode in this material.

The effective refractive index is equal to the ratio of the velocity c (speed of light in a vacuum) to the propagation speed of light in the material and according to the optical resonance mode considered. This effective index corresponds to the effective refractive index of the material for effective light propagation in the longitudinal direction.

$n_{eff,1}$ is a first effective refractive index, relative to a first optical resonance mode for propagation of a luminous flux of wavelength $\lambda_1$ in the material considered.

$n_{eff,j}$ is a $j^{th}$ effective refractive index, relative to a $j^{th}$ optical resonance mode for propagation of a luminous flux of wavelength $\lambda_j$ in the material considered.

The terms "substantially", "about", and "in the order of" mean "to within 10%" or, when referring to an angular orientation, "to within 10°". Thus, a direction substantially normal to a plane means a direction having an angle of 90±10° relative to the plane.

To determine the geometry of the LED and the compositions between the different doped and undoped or intrinsic regions, Scanning Electron Microscopy (SEM) or Transmission Electron Microscopy (TEM) analyses can be carried out.

The relative positioning of the different regions and metal contacts of the LED can be obtained from a cross-section.

Furthermore, an implantation of elements in a region, and in particular an implantation at different energies over the full height of the region, produces artefacts that are characteristic for a person skilled in the art (definition of the interface between the implanted region and the adjacent region, recovery of implantation defects). These characteristic artefacts can also be simulated by Monte Carlo-type methods and/or Finite Element Methods (FEM).

The chemical compositions of the different regions can be determined using the following well-known methods such as:

EDX or X-EDS, which stands for "energy-dispersive X-ray spectroscopy".

This method is well suited to analysing the composition of small devices such as µLEDs. It can be implemented on metallurgical sections within a Scanning Electron Microscope (SEM) or on thin slides within a Transmission Electron Microscope (TEM).

SIMS, which stands for "Secondary Ion Mass Spectroscopy".

ToF-SIMS, which stands for "Time-of-Flight Secondary Ion Mass Spectroscopy".

These methods provide access to the elemental composition of the different regions.

Figure 4A:
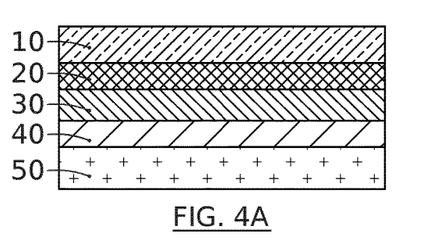
FIG. 4A, 5A, 6A show steps of producing a LED system according to a first embodiment of the present invention.

A first embodiment of at least one LED according to the invention will now be described with reference to FIGS. 4A, 5A and 6A. The LED 100 or the plurality of LEDs 100a, 100b obtained by this first embodiment is/are a GaN based and has/have a lateral injection mesa-free structure.

The LED 100 can advantageously be produced from a planar stack of layers 10, 20, 30, 40 on a substrate 50. Each layer 10, 20, 30, 40 of the stack extends in a basal plane and the stack is formed in a longitudinal direction preferably normal to the basal plane (FIG. 4A).

Conventionally, a GaN-n buffer layer 40 is preferably epitaxially grown on an $Al_2O_3$ sapphire substrate 50. This buffer layer 40 can have a thickness comprised between a few hundred nanometres and a few microns, typically 1 µm.

This buffer layer 40 is configured to limit the propagation of structural defects generated by heteroepitaxy, for example lattice mismatch dislocations, through the stack.

The substrate can alternatively be a silicon substrate or a silicon carbide substrate for example.

A GaN-n layer 30 can then be epitaxially grown on the buffer layer 40. This GaN-n layer 30 can have a thickness comprised between a few hundred nanometres and a few microns, typically 500 nm.

This GaN-n layer 30 has a lower dislocation rate than the buffer layer 40, preferably less than $10^{10}$ cm$^{-2}$, and more preferably less than or equal to $10^8$ cm$^{-2}$.

An unintentionally doped quantum well layer 20 comprising at least one InGaN-based quantum well can then be epitaxially grown on the GaN-n layer 30. The quantum wells preferably extend parallel to the basal plane.

These quantum wells can typically be a few nanometres thick, for example between 1 nm and 5 nm thick. They can be separated from one another by interposed GaN layers with thicknesses of a few nanometres, for example comprised between 3 nm and 15 nm.

The quantum well layer 20 can comprise between one and fifty quantum wells. It can have a thickness comprised between 10 nm and 500 nm, preferably between 10 nm and 200 nm in order to reduce the overall thickness of the stack.

A GaN-p layer 10 can then be epitaxially grown on the quantum well layer 20. This GaN-p layer 10 can have a thickness comprised between 20 nm and 200 nm.

The majority carriers in the GaN-p layer 10 are holes. This layer 10 can have a dopant concentration comprised between $10^{17}$ cm$^{-3}$ and $10^{19}$ cm$^{-3}$.

As the mobility of the holes is lower than that of the electrons, the radiative recombinations of electron-hole pairs take place mainly at the one or more first quantum wells adjoining this GaN-p layer 10.

Different epitaxy techniques can be implemented to form this stack in the longitudinal direction. For example and in a non-limiting manner, techniques include chemical vapour deposition (CVD), metalorganic vapour phase epitaxy (MOVPE), hydride vapour phase epitaxy (HVPE), atomic layer deposition (ALD), and molecular beam epitaxy (MBE). The stack is preferably formed within the same epitaxial frame.

One or more patterns can then be defined by lithography. Each pattern is intended to form a LED 100. Each pattern projected in the basal plane can be square, rectangular or circular in shape, for example. The projected patterns preferably form an array from which a LED array $100^M$ can be formed.

They can have a width, i.e. a main dimension in which they extend along the basal plane, comprised between 300 nm and 500 µm, preferably between 300 nm and 50 µm. A dimension in the order of 500 µm can be used to produce digital signage screens or signs, for example. A dimension of less than 50 µm or less than 30 µm allows µLED-based screens to be produced.

Each pattern preferably comprises a central region surrounded by a border.

The central region is masked after lithography, on an initially exposed face of the GaN-p layer 10, so as to protect the underlying stack at this central region.

This central region, intended to form an emissive zone, can have a width comprised between 300 nm and 10 µm.

The central region preferably comprises the first region 1 of the LED, formed in the GaN-p layer 10, and the second region 2 of the LED, formed in the quantum well layer 20.

The border is preferably left exposed after lithography, so that species or atoms, preferably of the donor type, can be implanted from the exposed face over the full height of the underlying stack.

This border can have a width comprised between 50 nm and 10 µm, preferably between 200 nm and 2 µm.

Figure 5A:
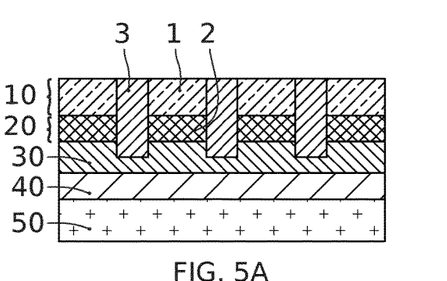

Ion implantation can be carried out into and/or through the GaN-p layer 10 and the quantum well layer 20 to delimit, on the one hand, the first and second regions 1, 2 of the LED 100, and on the other hand to form the third region 3 of the LED 100 (FIG. 5A).

This ion implantation is preferably configured to implant silicon to a total depth comprised between 10 nm and 10 µm, preferably between 30 nm and 500 nm, at concentrations comprised between $10^{17}$ cm$^{-3}$ and $10^{19}$ cm$^{-3}$.

This implementation advantageously allows the conductivity of the layer 10 to be reversed in the third region 3. A P-N junction is thus created between the second and third regions 2, 3 of the LED 100.

In particular, the GaN-p in the layer 10 can become GaN-n in the third region 3 after silicon implantation.

Different implantation energies can allow silicon to be implanted at different depths beneath the exposed face in the longitudinal direction, so as to obtain a relatively uniform distribution over the entire implantation depth.

In a known manner, an implantation depth profile as a function of energy can be estimated from Monte Carlo-type calculations. It is thus possible to adjust the energy variation as a function of the desired implantation depth.

This implantation depth substantially corresponds to the height of the third region 3.

For example, silicon implantation carried out with a VIISta 3000XP implanter by Applied Material, with an energy gradually varying between 10 keV and 500 keV can form a third N-type region 3 with a height of about 350 nm.

The implantation doses can be comprised between $10^{13}$ cm$^{-2}$ and $10^{16}$ cm$^{-2}$.

The first, second and third regions 1, 2, 3 of the LED 100 are formed after this ion implantation.

Optionally, activation and/or recovery annealing can be carried out. Activation annealing allows, for example, the implanted silicon atoms to be given a donor property. Recovery annealing is particularly useful in reducing structural defects associated with implantation. These activation and/or recovery annealings are typically carried out at temperatures comprised between 800° C. and 1,000° C., and for durations comprised between 15 minutes and 2 hours. In particular, these annealing temperatures and durations can be adjusted so as not to degrade the quantum wells of the quantum well layer 20. Such anneals are well known to a person skilled in the art.

Figure 6A:
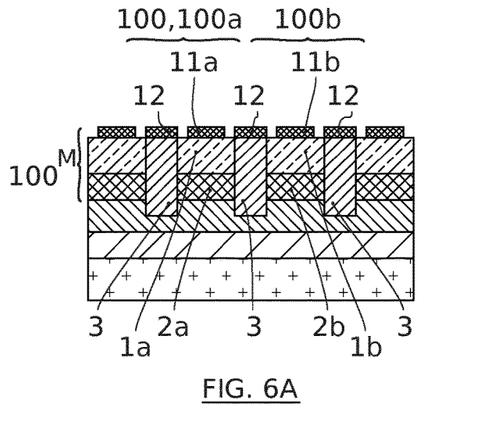

According to one embodiment shown in FIG. 6A, first metal contacts 11a, 11b, referred to as P-contacts, are deposited on the first P-type regions 1a, 1b and second metal contacts 12, referred to as N-contacts, are deposited on the third N-type regions 3, at the exposed face.

Advantageously, two adjacent diodes 100a, 100b thus share, at least in part, a third region 3 and the same N-contact 12. This limits the number of connections required to power the diodes 100a, 100b of the diode array 100$^M$.

Preferably, the N-contacts 12 allow electrons to be injected laterally from the third region 3 towards the first region 1a, 1b.

The P-contacts 11a, 11b allow holes to be injected into the first region 1a, 1b.

A hole in the first region 1, 1a, 1b can thus form an electron-hole pair in the central zone with an electron from the third region 3. This pair can then be annihilated by radiative recombination in a quantum well of the second region 2, 2a, 2b, typically and primarily in the quantum well running immediately alongside the first region 1, 1a, 1 b. A luminous flux of wavelength $\lambda_1$ is thus emitted.

For example, for GaN-based layers 10, 20 and InGaN-based quantum wells, the wavelength $\lambda_1$ can be comprised between 400 nm and 650 nm, preferably between 400 nm and 470 nm.

The luminous flux is preferably extracted at an emissive face opposite the face carrying the contacts 11a, 11 b, 12.

Such a LED 100 preferably emits blue light and can be referred to as a blue LED hereafter.

The lateral injection of carriers, in particular electrons, is particularly efficient and prevents the need for an electron blocking layer EBL. A comparison is shown in FIGS. 2A-2C and 3A-3C, respectively, between the results of a lateral injection LED according to the invention further comprising an EBL, and the results of a lateral injection LED according to the invention without an EBL.

FIG. 2B shows the WPE as a function of the anode current, corresponding to the current delivered at the P-contact of the LED, for a LED with an EBL of radius R=5 µm. The maximum efficiency or maximum wall plug efficiency WPEmax thereof is 12%.

By comparison, FIG. 3B shows the WPE as a function of the anode current for a LED without any EBL of radius R=5 µm. The maximum efficiency WPEmax thereof is 52%.

This maximum efficiency is significantly higher than that achieved by a lateral injection LED with an EBL. The relative efficiency difference is 40%.

FIG. 2C shows the WPE as a function of the anode current for a LED with an EBL of radius R=1 µm. The maximum efficiency WPEmax thereof is 5%.

By comparison, FIG. 3C shows the WPE as a function of the anode current for a LED without any EBL of radius R=1 µm. The maximum efficiency WPEmax thereof is 65%. The relative efficiency difference in this case is 60%.

The lateral injection LED according to the invention thus advantageously makes it possible to form a µLED, in particular with a main dimension of extension in the basal plane of less than or equal to 12 µm.

Other embodiments of LEDs 100, 100a, 100b according to the invention are described hereinbelow. Only features that differ from the preceding embodiment are described hereinbelow; the remaining features not described are considered to be identical to those of the preceding embodiment.

Figure 4B:
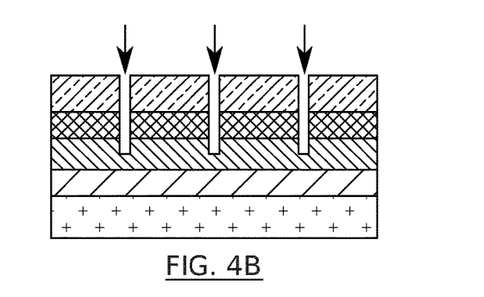
FIG. 4B, 5B, 6B show steps of producing a LED system according to a second embodiment of the present invention.
Figure 5B:
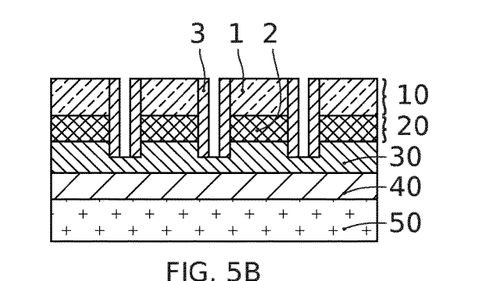
Figure 6B:
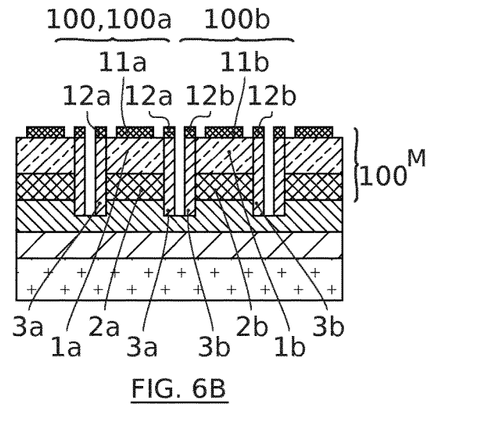

According to one embodiment shown in FIGS. 4B, 5B and 6B, the LED 100 further has a mesa structure.

In order to obtain this mesa structure, lithography and etching are preferably carried out after the formation of the stack of the layers 10, 20, 30, 40, before the definition of the LED pattern.

Lithography allows the areas to be etched to be defined.

The etching can be configured so as to form trenches around each LED at least partially through the stack of the layers 10, 20, 30 (FIG. 4B). These trenches preferably run alongside each LED, at the periphery of the border of each LED pattern.

In one possibility, the trenches have a depth greater than or equal to the sum of the thicknesses of the first and second layers 10, 20.

Anisotropic etching, for example RIE (Reactive Ion Etching) or plasma etching using chlorine species, allows such trenches to be made substantially in the longitudinal direction.

Two adjacent LEDs 100a, 100b are preferably separated by the same trench.

The trenches preferably have a width of greater than or equal to 200 nm. This limits or prevents mutual optical coupling between adjacent LEDs.

The mesa structure is known to optically isolate at least part of the emissive zone of the LED and/or to guide the propagation of a luminous flux emitted by the emissive zone.

More specifically, the luminous flux is confined to the inside of the mesa by the refractive index contrast between the inside of the mesa and the trench.

After etching, ion implantation of silicon along the border of the LED pattern, along the edges of the mesa, can be carried out (FIG. 5B).

This implementation allows both the third region 3 of each LED to be formed, and the free edges of the mesa to be passivated.

The implantation depth is preferably substantially equal to the etching depth.

First contacts 11a, 11b can then be deposited on the first regions 1a, 1b of the LEDs 100a, 100b, and second contacts 12a, 12b can then be deposited on the third regions 3a, 3b at the exposed face.

The LED 100a thus preferably comprises a second contact 12a separated from another second contact 12b of the adjacent LED 100b.

The LEDs 100a, 100b are electrically independent from one another and can be controlled independently.

Lateral injection, mesa-structured LEDs 100a, 100b are thus produced.

The space charge region, extending laterally from the P-N junction between the first and third regions 1, 3, and the injection of electrons towards the central zone advantageously allow the electron-hole pairs to be confined to the central zone. The free edges of the mesa thus do not interfere with the radiative recombination mechanisms, unlike a LED with a conventional mesa structure.

The LEDs 100a, 100b according to this embodiment thus have both optical confinement and electronic confinement, respectively enabling the mutual optical coupling between LEDs to be limited and the radiative recombination rate of the LEDs to be optimised.

Figure 7A:
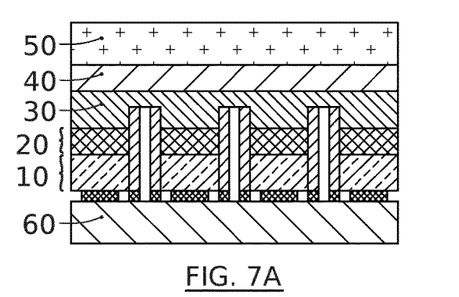
FIGS. 7A and 8A show transfer and thinning steps of a process for producing LEDs according to one embodiment of the present invention.
Figure 8A:
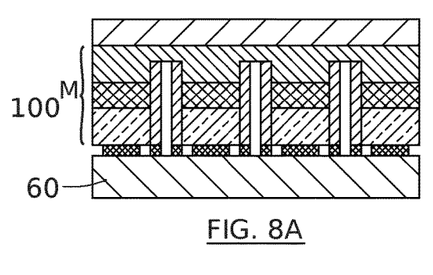

As shown in FIGS. 7A and 8A, the plurality of LEDs formed on the substrate 50 are then transferred to control electronics 60.

The first and second contacts 11, 12 of the LEDs are advantageously carried on one and the same face, the exposed face of the GaN-p layer 10, which facilitates connection with the control electronics 60 (FIG. 7A).

Various transfer and connection methods well known to a person skilled in the art and common practice in the microelectronics industry can be used to connect the control electronics 60 and the plurality of LEDs.

Flipping and transferring can be carried out, for example, by a so-called "flip chip" method.

A first thinning operation carried out from the rear face of the substrate 50 can then take place so as to remove the substrate 50, preferably the buffer layer 40 and preferably at least partly the GaN-n layer 30 (FIG. 8A).

This first thinning operation can take place by a first mechanical trimming, typically with a coarse abrasive so as to quickly remove at least 90% of the desired thickness, followed by a chemical-mechanical polishing allowing the removal of the residual thickness to be controlled with precision.

The first thinning operation brings the emissive face closer to the emissive zone. This advantageously improves the extraction of the luminous flux emitted by the diode.

The first thinning also facilitates or improves the integration of the diode array $100^M$ into a display screen for example, by reducing the overall dimensions of this array.

Figure 7B:
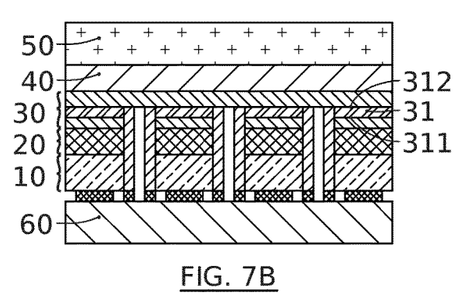
FIGS. 7B and 8B show transfer and thinning steps of a process for producing LEDs according to another embodiment of the present invention.
Figure 8B:
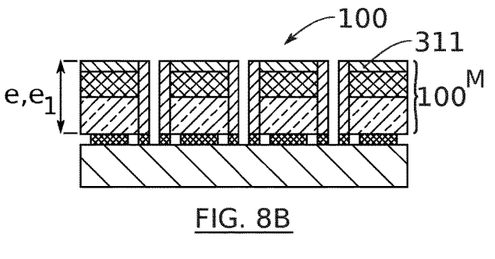

According to one embodiment shown in FIGS. 7B and 8B, the thickness removed by thinning can be precisely controlled by means of an etch stop layer 31 previously integrated into the stack.

In particular, an AlGaN- or AlN-based etch stop layer 31 can be formed within the GaN-n layer 30 during the epitaxy of this GaN-n layer.

The position of this etch stop layer 31 heightwise in the GaN-n layer 30, and the thickness of this etch stop layer 31, can advantageously be controlled with precision.

Before flipping, trenches are preferably etched such that they pass at least partially through the etch stop layer 31.

For example, etching of the trenches can be configured so as to pass through the entire thickness of the etch stop layer 31, at least as far as a first interface 311 and preferably as far as a second interface 312 between this etch stop layer 31 and the layer 30.

After flipping and after the first mechanical thinning, a second thinning can advantageously be carried out by etching the layer 30.

This etching of the layer 30 is preferably chosen so as to procure good selectivity with respect to the etch stop layer 31.

In particular, for a GaN-based layer 30 and an AlGaN-based etch stop layer 31, photoelectrochemical etching can have a selectivity $S_{AlGaN/GaN}$ greater than 100:1.

For a GaN-based layer 30 and an AlN-based etch stop layer 31, photoelectrochemical etching can also have a selectivity $S_{AlN/GaN}$ greater than 100:1.

Reference can be made, for example, to the document "Selective Etching of GaN from AlGaN/GaN and AlN/GaN Structures, Journal of Nitride Semiconductor Research, J. A. Grenko, Volume 9 (2004)" in order to implement such an etching.

This makes it easier to stop the etching. At the end of this etching, the thinning operation is stopped at the first interface 311.

The stack thus has a residual thickness e.

This residual thickness e corresponds to the height $e_1$ of the LEDs 100 in the LED array $100^M$.

The interface 311 can thus correspond to the emissive face of the diodes.

The height $e_1$ of the LEDs can advantageously be controlled with precision by the positioning of the etch stop layer 31 within the layer 30.

In particular, according to one preferred embodiment, the height $e_1$ of the LEDs can be chosen such that:

$$e_1 = M_1 \frac{\lambda_1}{2n_{eff,1}}$$

Where $M_1$ is an integer, $\lambda_1$ is the emission wavelength and $n_{eff,1}$ is the effective refractive index in the LEDs. Resonant cavity LEDs, referred to as RCLEDs, can thus be formed (FIG. 8B).

These RCLEDs emit a luminous flux of wavelength $\lambda_1$ mainly in the longitudinal direction.

Preferably $M_1=1$ is chosen to form single-mode RCLEDs. This configuration advantageously prevents propagation of the luminous flux along the border of the RCLED in other resonance modes of the cavity.

In the description hereinbelow, the blue LEDs can comprise RCLEDs.

In order to form LEDs emitting at other wavelengths, for example green at a wavelength $\lambda_2$ and red at a wavelength $\lambda_3$, wavelength converters $c_j$ (j=2 . . . 3) can be added to the blue LEDs.

Typically, a converter $c_2$ configured to produce a luminous flux of wavelength $\lambda_2$ from the luminous flux of wavelength $\lambda_1$ can be associated with a blue LED.

A converter $c_3$ configured to produce a luminous flux of wavelength $\lambda_3$ from the luminous flux of wavelength $\lambda_1$ can be associated with a blue LED.

Advantageously, colour pixels of a display screen can thus be formed.

A green LED thus corresponds to a green sub-pixel of a colour pixel.

A red LED thus corresponds to a red sub-pixel of a colour pixel.

A blue LED, without a converter, corresponds to a blue sub-pixel of a colour pixel.

These wavelength converters $c_j$ (j=2 . . . 3) can comprise quantum dots (QDs).

These QDs can be, for example, nanoparticles or nanocrystals of varying size and composition. The wavelength (j=2 . . . 3) re-emitted by the QDs depends in particular on the size and the composition thereof.

Advantageously, QD-loaded photoresists can be used to form the green and red sub-pixel arrays on the blue-LED array $100^M$.

For example, after depositing a first QD-loaded photoresist of a first type, for example CdSe/ZnS- or InP/ZnS- or CdSe/CsS/ZnS-based core/shell nanoparticles, and with a size in the order of a few nanometres to a few tens of nanometres, for example comprised between 2 nm and 100 nm, a first lithography can be carried out to form the green sub-pixel array.

After depositing a second QD-loaded photoresist of a second type, for example CdSe/CdS- or InP/CdS-based core/shell nanoparticles, and with a size in the order of a few nanometres to a few tens of nanometres, for example comprised between 2 nm and 100 nm, a second lithography can be carried out to form the red sub-pixel array.

The QDs of the second type can be of the same nature as the QDs of the first type, differing only with regard to the core/shell size ratio.

Alternatively, converters $c_j$ (j=2 . . . 3) comprising quantum wells (QW) can be associated with the blue LEDs. Such quantum well converters can be produced by deposition(s) and/or epitaxy(-ies).

The deposition parameters, for example the speed of rotation for spin coating, can advantageously allow converters $c_j$ (j=2 . . . 3) to be formed in the form of layers of controlled thicknesses.

Figure 9A:
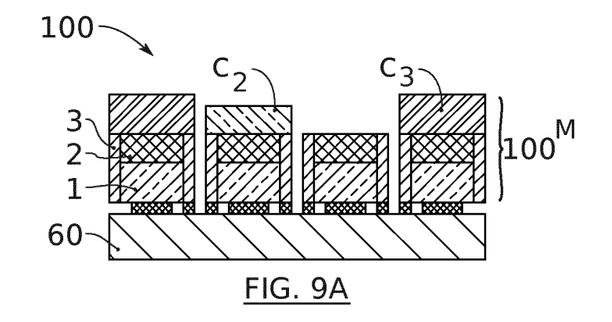
FIGS. 9A, 9B and 9C show LED systems with converters according to different embodiments of the present invention.

According to one embodiment shown in FIG. 9A, these wavelength converters $c_j$ (j=2 . . . 3) can be deposited directly on the blue-LED array $100^M$ in contact with the emissive face of the LEDs.

Figure 9B:
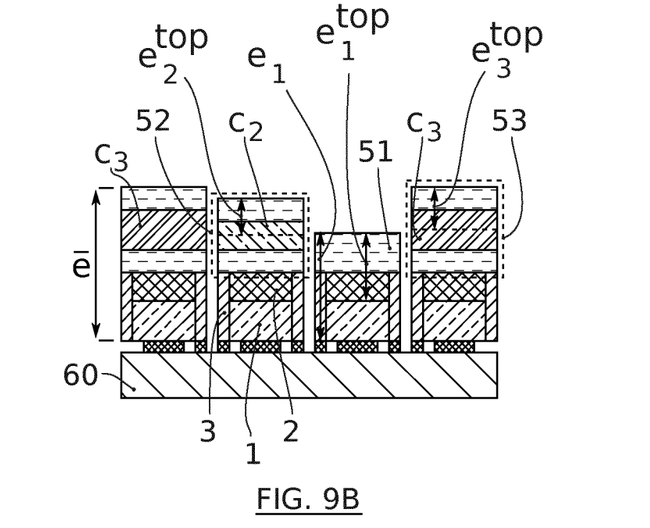

Alternatively, according to one embodiment shown in FIG. 9B, these wavelength converters $c_j$ (j=2 . . . 3) can be coupled with the blue LEDs, preferably by being integrated inside a resonant optical cavity.

In particular, a layer of converter $c_2$, $c_3$ can be sandwiched between two transparent layers, made of $TiO_2$ or $ZrO_2$ for example, to form a stack 52, 53 in the longitudinal direction, directly in contact with the emissive face of the blue LED.

The stack 52, 53 and the blue LED have an overall height $\bar{e}$.

The different layer thicknesses are preferably chosen such that:

$$\bar{e} = M_1 \frac{\lambda_1}{2n_{eff1}} = M_j \frac{\lambda_j}{2n_{effj}}$$

Where $M_1$, $M_j$ are integers and where $M_{j1}$ is different from $M_1$ or equal to $M_1$, $\lambda_1$ and (j=2 . . . 3) are the emission and conversion wavelengths respectively, and $n_{eff1}$, $n_{effj}$ are a first and a $j^{th}$ effective refractive index respectively.

Thus, the stack 52, 53 and the blue LED form a resonant optical cavity for each of the two emission and conversion wavelengths, optionally for different optical resonance modes.

According to one preferred embodiment, the different layer thicknesses are selected such that a mid-plane of the converter layer $c_j$ (j=2 . . . 3) is positioned at a height $e_j^{top}$ (j=2 . . . 3) relative to a top end of the resonant cavity, where:

$$e_j^{top} = (2M_j' + 1)\frac{\lambda_j}{4n_{eff,j}} \ (j = 2 ... 3)$$

Where $M_j'$ is an integer.

The converter $c_j$ (j=2 . . . 3) is thus advantageously positioned on an antinode of an optical resonance mode. The extraction efficiency of the luminous fluxes of wavelength $\lambda_j$ (j=2 . . . 3) at the top end of the resonant cavity is thus maximised.

The converter-free blue LED can further comprise a transparent layer, made of $TiO_2$ or $ZrO_2$ for example, to form a resonant cavity of height $e_1$ for the wavelength $\lambda_1$.

The thickness of this transparent layer is preferably chosen such that the first quantum well of the second region 2 adjacent to the first region 1 is positioned at a height $e_1^{top}$ relative to a top end of the resonant cavity, such that:

$$e_1^{top} = (2M' + 1)\frac{\lambda_1}{4n_{eff,1}}$$

This first quantum well, where most of the radiative recombinations take place, is thus advantageously positioned on an antinode of an optical resonance mode. The extraction efficiency of the luminous flux of wavelength $\lambda_1$ at the top end of the resonant cavity is thus maximised.

Figure 9C:
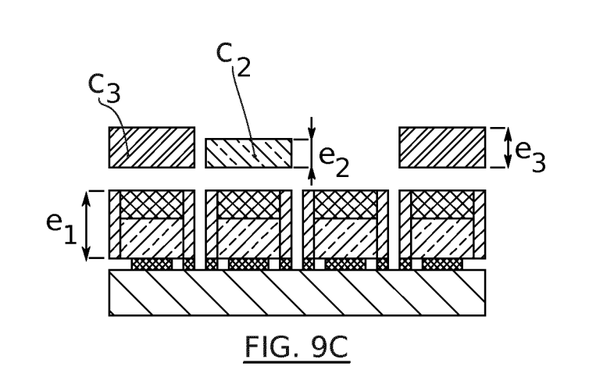

Alternatively, according to one embodiment shown in FIG. 9C, these wavelength converters $c_j$ (j=2 . . . 3) can be remote or decoupled from the blue LEDs.

An air gap, for example, can separate the converters from the blue LEDs.

The blue LEDs are preferably RCLEDs having a height $e_1$ in order to obtain, at the emissive face thereof, a directional luminous flux mainly in the longitudinal direction.

The converters $c_j$ (j=2 . . . 3) can advantageously comprise a resonant conversion cavity independent from the resonant cavity of the RCLEDs.

For example, these converters $c_j$ (j=2 . . . 3) can be layers of thickness $e_j$=2 . . . 3) comprising QDs, where:

$$e_j = M_j \frac{\lambda_j}{2n_{\mathit{eff},j}}$$

These converter layers are thus respectively resonant for the wavelengths $\lambda_j$.

Such a configuration comprising RCLEDs separated from the converters which are themselves resonant advantageously simplifies the production of the red and green sub-pixels of a colour pixel of a display screen.

Figure 10:
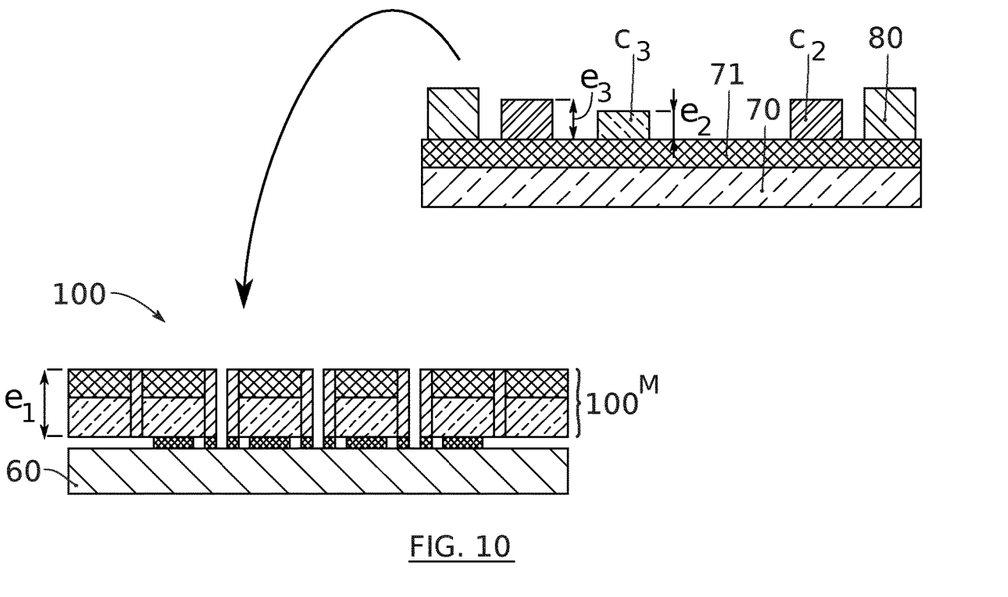
FIGS. 10 and 11 show the production of a display screen using a LED system according to one embodiment of the present invention.

More specifically, the converters $c_2$, $c_3$ converters can be formed by lithographies of QD-loaded photoresists and deposited on a glass substrate 70, independently from the production of the blue-LED array $100^M$, as shown in FIG. 10.

Preferably, but optionally, a layer 71 of distributed Bragg reflectors (DBRs) can be sandwiched between the glass substrate 70 and the converters $c_2$, $c_3$.

This DBR layer 71 is preferably configured to have a broad reflection band comprising the wavelengths $\lambda_2$ and $\lambda_3$.

It can be produced from alternating $TiO_2$- and $SiO_2$-based layers. For example, reference can be made to the document "Fabrication and characterization of $TiO_2/SiO_2$ based Bragg reflectors for light trapping applications, R. S. Dubey, Results in Physics, Volume 7, 2017, Pages 2271-2276" to form this DBR layer 71.

The converters $c_2$, $c_3$ formed on the glass substrate 70 can thus be transferred opposite the blue LEDs of the array $100^M$ in order to form the different blue, red and green sub-pixels.

The substrate 70 carrying the converters $c_2$, $c_3$ thus aligned with the blue LEDs can be secured to the array $100^M$ connected to the control electronics 60, for example by means of an adhesive bead or adhesive pads 80.

Figure 11:
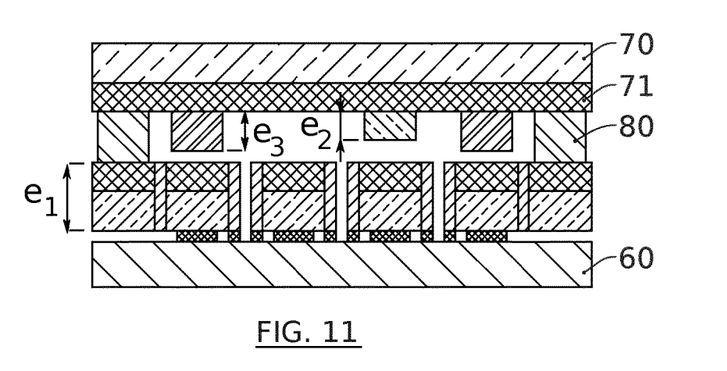

As shown in FIG. 11, a display screen comprising colour pixels, each comprising lateral-injection RCLED-based sub-pixels can thus be produced.

The invention is not limited to the aforementioned embodiments, and includes all the embodiments covered by the claims.

In particular, embodiments can be combined with one another to obtain a LED or an optoelectronic system.

For example, a mesa-structured, GaN-based, lateral-injection LED or RCLED comprising a remote converter can be formed.

A mesa-structured, GaN-based, lateral-injection LED or RCLED comprising an integrated converter can be formed.

A mesa-free, GaN-based, lateral-injection LED or RCLED comprising an integrated converter can be formed.

The invention claimed is:

1. A light-emitting diode configured to emit a luminous flux of wavelength $\lambda_i$ (i=1 . . . 3), comprising a first region having one of either a P-type electric conductivity or an N-type electric conductivity, formed in a first layer extending in a basal plane, a second region formed in a second layer, said second region forming a stack with the first region in a direction normal to the basal plane, referred to as a longitudinal direction, and comprising at least one quantum well extending parallel to said basal plane, and a third region having the other of either a P-type electric conductivity or an N-type electric conductivity, wherein the third region extends in the longitudinal direction bordering and in contact with the first and second regions through the first and second layers, and having a mesa structure comprising the first and second regions and wherein the third region forms an edge of said mesa structure, said edge having a free surface substantially normal to the basal plane.

2. The light-emitting diode according to claim 1, wherein the stack forms a resonant cavity in the longitudinal direction for a luminous flux of wavelength $\lambda_i=\lambda_1$, said cavity having a height $e_1$ in the longitudinal direction such that:

$$e_1 = M_1 \frac{\lambda_j}{2n_{\mathit{eff},1}}$$

where $M_1$ is an integer, $\lambda_1$ is the wavelength and $n_{\mathit{eff},1}$ is a first effective refractive index.

3. The light-emitting diode according to claim 2, wherein the at least one quantum well is located at a height $e_1^{top}$ in the longitudinal direction from an end of the resonant cavity opposite the first region (1), such that:

$$e_1^{top} = (2M_1' + 1) \frac{\lambda_1}{4n_{\mathit{eff},1}}$$

where $M_1'$ is an integer different from $M_1$ or equal to $M_1$.

4. The light-emitting diode according to claim 1, further comprising a wavelength converter $c_j$ (j=2 . . . 3) disposed along a longitudinal axis of the diode and configured to produce a luminous flux of wavelength $\lambda_i=\lambda_j$ (j=2 . . . 3) from an emitted luminous flux of wavelength $\lambda_i=\lambda_1$.

5. The light-emitting diode according to claim 4, wherein the stack comprises the wavelength converter $c_j$ (j=2 . . . 3) and forms resonant cavity in the longitudinal direction for the luminous flux of wavelength $\lambda_1$ and for the luminous flux of wavelength $\lambda_j$ (j=2 . . . 3), said cavity having a height $\bar{e}$ in the longitudinal direction such that:

$$\bar{e} = M_1 \frac{\lambda_1}{2n_{\mathit{eff}1}} = M_j \frac{\lambda_j}{2n_{\mathit{eff}j}}$$

where $M_1$, $M_j$ are integers and where $M_j$ is different from $M_1$ or equal to $M_1$, $\lambda_1$ and $\lambda_j$ (j=2 . . . 3) are the so-called emission and conversion wavelengths respectively, and $n_{\mathit{eff}1}$, $n_{\mathit{eff}j}$ are a first and a $j^{th}$ effective refractive index respectively.

6. The light-emitting diode according to claim 5, wherein the wavelength converter $c_j$ (j=2 . . . 3) has a centre located at a height $e_j^{top}$ (j=2 . . . 3) in the longitudinal direction from a top end of the resonant cavity such that:

$$e_j^{top} = (2M_j' + 1) \frac{\lambda_j}{4n_{\mathit{eff},j}}$$

where $M_j'$ is an integer, $\lambda_j$ is the wavelength and $n_{\mathit{eff},j}$ is a $j^{th}$ effective refractive index.

7. The light-emitting diode according to claim 4, wherein the wavelength converter $c_j$ (j=2 . . . 3) comprises a resonant conversion cavity.

8. The light-emitting diode according to claim 7, wherein the resonant conversion cavity has a height $e_j$ (j=2 . . . 3) in the longitudinal direction such that:

$$e_j = M_j \frac{\lambda_j}{2n_{\mathit{eff},j}}$$

where $M_j$ is an integer, $\lambda_j$ is the wavelength and $n_{\mathit{eff},j}$ is a $j^{th}$ effective refractive index.

9. The light-emitting diode according to claim 7, wherein the resonant conversion cavity is bordered, at least in part, by Bragg reflectors extending parallel to the basal plane and configured to be at least partially reflective for a luminous flux of wavelength $\lambda_i = \lambda_j$ (j=2 . . . 3) and transparent for a luminous flux of wavelength $\lambda_i = \lambda_1$.

10. The light-emitting diode according to claim 4, wherein the wavelength converter $c_j$ (j=2 . . . 3) comprises at least one of either quantum dots or two-dimensional quantum wells.

11. The light-emitting diode according to claim 1, further comprising a first metal contact formed on the first region and a second metal contact formed on the third region and wherein the first and second contacts are carried on one and the same face of the diode.

12. An optoelectronic system comprising a plurality of light-emitting diodes, the light-emitting diodes of the plurality of light-emitting diodes configured to emit a luminous flux of wavelength $\lambda_i$ (i=1 . . . 3), the light emitting diodes of the plurality of light-emitting diodes comprising a first region having one of either a P-type electric conductivity or an N-type electric conductivity, formed in a first layer extending in a basal plane, a second region formed in a second layer, said second region forming a stack with the first region in a direction normal to the basal plane, referred to as a longitudinal direction, and comprising at least one quantum well extending parallel to said basal plane, and a third region having the other of either a P-type electric conductivity or an N-type electric conductivity, wherein the third region extends in the longitudinal direction bordering and in contact with the first and second regions through the first and second layers, and the light-emitting diodes of said plurality being juxtaposed with one another in the basal plane at the respective third regions thereof, the system further comprising diode control electronics contacted at a face of the plurality of diodes carrying a plurality of first contacts and of second contacts formed respectively on the first and third regions of each of the diodes of said plurality of diodes.

13. The system according to claim 12, further comprising a plurality of wavelength converters $c_j$ (j=2 . . . 3) configured to produce luminous fluxes of wavelength $\lambda_i = \lambda_j$ (j=2 . . . 3) from an emitted luminous flux of wavelength $\lambda_i = \lambda_1$, each of the converters of said plurality of converters being associated with one diode of the plurality of diodes, so as to form colour pixels.

14. A process for producing at least one light-emitting diode configured to emit a luminous flux of wavelength $\lambda_i$ (i=1 . . . 3) comprising the following steps of:
 forming a stack in one direction, referred to as a longitudinal direction, comprising:
  a GaN buffer layer deposited on a first substrate extending in a basal plane normal to the longitudinal direction,
  an N-doped GaN layer deposited on the first buffer layer,
  an unintentionally doped quantum well layer comprising at least one InGaN-based quantum well extending parallel to the basal plane, and
  a P-doped GaN layer deposited on the quantum well layer,
 lithographically defining, on an exposed face of the P-doped GaN layer, at least one pattern comprising a central region and a border surrounding this central region,
 implanting silicon at each border from the exposed face to a depth greater than or equal to the sum of the thicknesses of the P-doped GaN layer and of the quantum well layer, so as to delimit, in each central region, a first P-type region in the P-doped GaN layer and a second region in the quantum well layer, and so as to form a third N-type region in the implanted material, and
 depositing a first metal contact on the first region and a second metal contact on the third region at the exposed face, so as to form at least one light-emitting diode configured to emit a luminous flux of wavelength $\lambda_i = \lambda_1$.

15. A light-emitting diode configured to emit a luminous flux of wavelength $\lambda_i$ (i=1 . . . 3), comprising a first region having one of either a P-type electric conductivity or an N-type electric conductivity, formed in a first layer extending in a basal plane, a second region formed in a second layer, said second region forming a stack with the first region in a direction normal to the basal plane, referred to as a longitudinal direction, and comprising at least one quantum well extending parallel to said basal plane, and a third region having the other of either a P-type electric conductivity or an N-type electric conductivity, wherein the third region extends in the longitudinal direction bordering and in contact with the first and second regions through the first and second layers, and comprising a first metal contact formed on the first region and a second metal contact formed on the third region and wherein the first and second contacts are carried on one and the same face of the diode.

\* \* \* \* \*